US007551498B2

(12) United States Patent
Bartoli et al.

(10) Patent No.: US 7,551,498 B2
(45) Date of Patent: Jun. 23, 2009

(54) IMPLEMENTATION OF COLUMN REDUNDANCY FOR A FLASH MEMORY WITH A HIGH WRITE PARALLELISM

(75) Inventors: Simone Bartoli, Cambiago (IT); Stefano Surico, Milan (IT); Andrea Sacco, Alessandria (IT); Maria Mostola, Cavenago Dibrianza (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/611,452

(22) Filed: Dec. 15, 2006

(65) Prior Publication Data
US 2008/0144379 A1    Jun. 19, 2008

(51) Int. Cl.
G11C 7/00 (2006.01)
(52) U.S. Cl. .................. 365/200; 365/196; 365/189.05; 365/205; 365/189.07
(58) Field of Classification Search ................ 365/200, 365/196, 189.05, 205, 189.07
See application file for complete search history.

(56) References Cited

U.S. PATENT DOCUMENTS

| 5,455,798 | A |   | 10/1995 | McClure |
| 5,471,426 | A | * | 11/1995 | McClure ..................... 365/200 |
| 5,550,394 | A | * | 8/1996  | Sukegawa et al. .......... 257/209 |
| 5,838,619 | A | * | 11/1998 | Pascucci ................. 365/185.09 |
| 6,240,029 | B1 | * | 5/2001 | Callahan .................... 365/200 |
| 6,563,732 | B2 |   | 5/2003 | Matarrese et al. |
| 6,618,299 | B2 |   | 9/2003 | Sohn et al. |
| 7,088,627 | B1 |   | 8/2006 | Bajwa et al. |
| 2003/0053348 | A1 |   | 3/2003 | Marotta |
| 2005/0028054 | A1 |   | 2/2005 | Roohparvar |
| 2007/0223292 | A1 | * | 9/2007 | Moogat et al. .............. 365/200 |

FOREIGN PATENT DOCUMENTS
WO   WO-2008076553 A2   6/2008

OTHER PUBLICATIONS
"International Application Serial No. PCT/US2007/084460, Search Report mailed Nov. 10, 2008", 3 pgs.
"International Application Serial No. PCT/US2007/084460, Written Opinion mailed Nov. 10, 2008", 6 pgs.

* cited by examiner

Primary Examiner—Thong Q Le
(74) Attorney, Agent, or Firm—Schwegman, Lundberg & Woessner P.A.

(57) ABSTRACT

A redundant memory array has r columns of redundant memory cells, r redundant senses, and a redundant column decoder. Redundant address registers store addresses of defective regular memory cells. Redundant latches are provided in n groups of r latches. Redundancy comparison logic compares addresses of defective regular memory cells with an external input address. If the comparison is true, what is provided is: a DISABLE_LOAD signal to disable the regular senses for one of the n groups of m columns, an ENABLE_LATCH signal to one of the n groups of m columns to disables corresponding regular senses, and one or r REDO signals to a respective one of the r redundant latches in one of the n groups that is disabled. The selected one of the redundant latches activates one of the r redundant senses to access a redundant column.

29 Claims, 6 Drawing Sheets

Fig._4

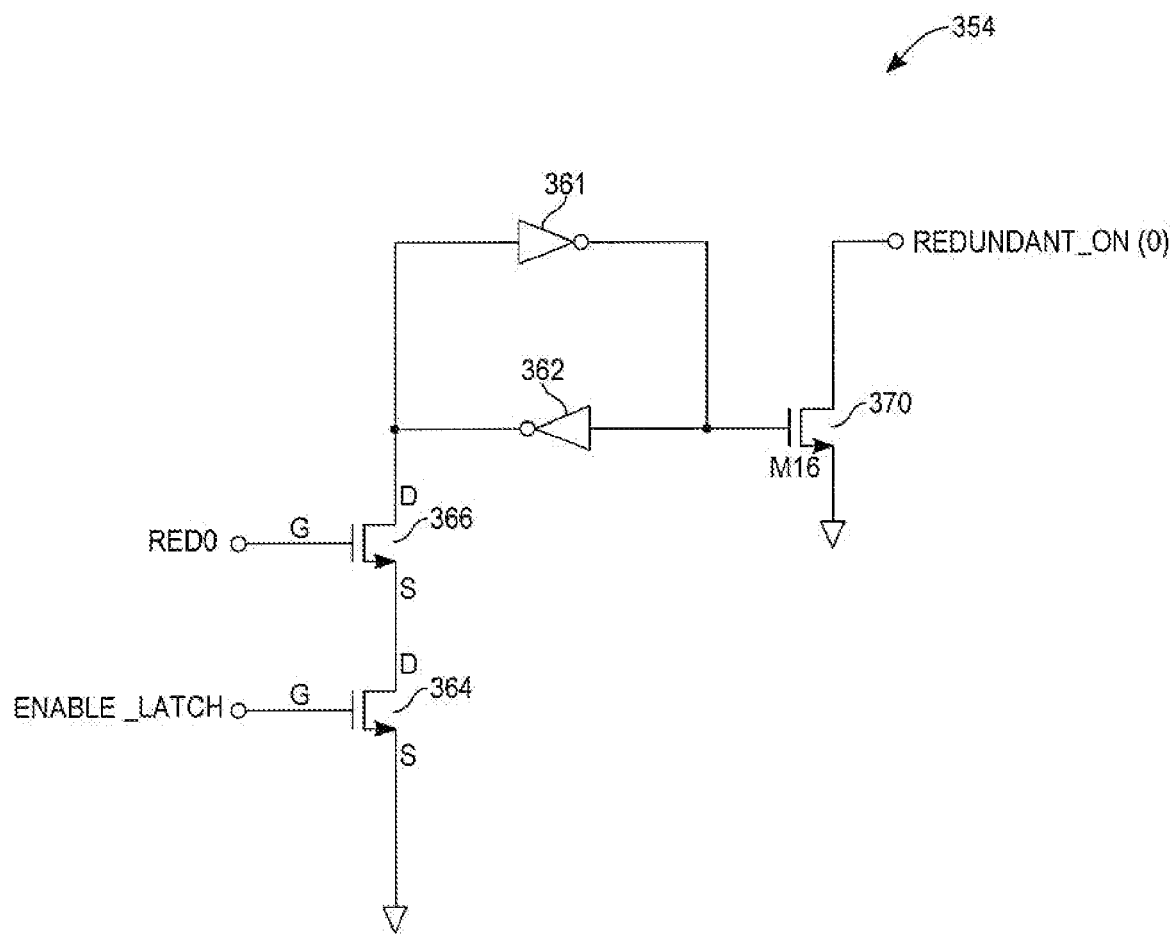
Fig. _ 7 though. In some flash devices, for example, up to 1024 cells can be programmed in parallel, which means that 1024 sense circuits are activated at the same time.

IMPLEMENTATION OF COLUMN REDUNDANCY FOR A FLASH MEMORY WITH A HIGH WRITE PARALLELISM

TECHNICAL FIELD

The present invention relates to flash memories and, more particularly, to redundant columns for flash memories.

BACKGROUND ART

FIG. 1 shows a flash memory device 100 that typically includes one or more memory arrays or sub-arrays, shown as 102, that is organized into n rows and m columns of flash memory cells. For example, an exemplary 8 Mbit memory array has n=4096 rows and m=2048 columns. A 23-bit address for a particular one of the memory cells in the array 102 is applied to a predecoder 104. The predecoder 104 provides 12 row address bits on a row-address bus 106 to a row decoder 108. The predecoder 104 also provides 11 address bits on a column-address bus 110 to a column decoder 112.

For accessing a particular row, the row decoder 108 provides a row select signal to one of 4096 row decoder output lines in a bus 114, where each one of the 4096 row decoder output lines is coupled to a respective one of 4096 row select terminals of the memory array 102.

The 2048 columns are arranged in 16 groups of 128 columns. The columns are coupled on a 2048-line bus 116 between the 2048 columns of the memory array 102 and 2048 respective decoders in the column decoder 112. The 2048 decoders are coupled to sense and senses circuitry 120 through a 2048-line bus 119. The sense and sense circuitry 120 is coupled to sixteen input/output (I/O) lines on a data bus 122. The sense amplifier circuits 120 are used to read the contents of the selected memory cells. During a write or modify operation, the sense amplifier circuits 120 are used to verify the correctness of the contents of modified cells.

In general, the number of data I/O lines of a memory device can be 1 bit, a byte (8 bits), a word (16 bits) or a double word (32 bits). As mentioned previously, the memory columns are arranged in groups, where each group corresponds to one particular output bit. For example, if the data output of a memory device is a 16-bit word then the columns internally are arranged in 16 groups, where each group has a number of columns assigned to it. During a read operation or a verify operation, 16 columns are selected, one from each group of columns, along with a row selection, so that 16 memory cells will be read or verified. Each of the 16 cells provides one of the 16 bits of the data output. This means that for each address applied to the memory device at lease 16 flash memory cells are selected in parallel.

FIG. 2 is a diagram that illustrates how columns are arranged in groups corresponding to one bit of a 16-bit output word. For example, a memory array with 2048 columns is arranged in 16 column groups with 128 columns related to one of the sixteen I/O outputs for each group. A typical column group 130 for the <0> bit of a 16 bit word having bit<0> to bit<15> is illustrated in FIG. 2. The 128 columns lines from the typical column group 130 are coupled through a bus 132 having 128 column lines to corresponding typical column decoder/sense amplifier circuits 134, which have a DATA<0> I/O bit provided on a signal line 136. Fifteen other similar column groups and corresponding column decoder/ sense amplifier circuits provide respective DATA<1> to DATA <15> I/O bits.

During the manufacture of flash memory devices, some flash memory cells in the memory array 102 can be defective and operate improperly. A defective memory cell can prevent memory data designated for storage in that defective memory cell from being correctly read or modified. To reduce the effect of defective flash memory cells on product yield, redundant flash memory cells are often employed to selectively replace normal flash memory cells that exhibit incorrect behavior during a device testing phase. To store addresses of defective flash memory cells, one or more non-volatile redundant address registers are provided.

FIG. 3 illustrates a conventional flash memory redundant column system 150 for a memory array. The memory array includes a regular flash memory array 152 that is coupled to a regular column decoder circuit 154. A redundant memory array 156 is coupled to a redundant column decoder 158. The regular column decoder 154 is coupled to regular senses 160, and the redundant column decoder 158 is coupled to redundant senses 162. The regular senses 160 have, for example, sixteen I/O lines 164 that are used for transferring data into and out of the memory array system.

A command user interface (CUI) circuit 170 receives a write enable (WE) signal at a terminal 172 and provides to the senses 160 on signal line 174 an output signal LOAD_PL. The LOAD_PL signal is a signal pulse that is generated by the rising edge of the WE signal. The LOAD_PL pulse triggers the latching of data and addresses in the regular senses 160.

Redundant address registers 180 store the addresses of defective memory cells, which are provided to a redundant logic circuit 182. Input memory addresses are also provided to the redundant logic circuit 182. The redundant logic circuit 182 compares the input memory addresses to addresses of defective regular memory cells provided by the redundant address registers 180. For a positive comparison, or match, the redundant logic circuit 182 also activates a particular one of 2048 SENSE_DISAB signals on a 2048-bit bus 184 to disable a sense for a defective memory cell and also to activate one of 4 (in this example) redundant senses 162 with one of four REDUNDANT_ON signals provided on a bus 166.

In summary, the input addresses associated with a given read or write memory operation are compared to all the addresses stored in the redundant address registers 180. If an input address matches one of the addresses of a defective memory cell that is stored in the redundant address registers 180, the redundant logic circuit 182 switches off a normal address decoding path with one of the 2048 SENSE_DISAB signals on the 2048-bit bus 184 and an associated sense circuit and alternatively enables the redundant senses 162.

Conventionally, during a write, or programming, operation, data to be written into flash memory locations are stored locally in each sense circuit for a verify operation. The sense circuit compares the sense output, after the verify operation, with the data to be written and, according to the comparison result, controls the associated bit line voltage to either enable or to disable the write operation. Each of the redundant memory cells has its own sense and sense circuit. An external input address applied to the memory is compared with the contents of the redundant address registers 180. If a match occurs with a column address of a defective memory cell stored in the redundant address registers, redundant circuits are activated. The redundant circuits disable the sense and the sense circuits associated with the defective cell and activate the sense and sense circuits for the redundant cell.

During a write, or programming, operation, the number of senses activated corresponds to the number of cells to be programmed in parallel. This number can be very high in some flash memory devices to allow a high program throughput. In order to minimize the number of redundant cells required to be added to the memory array, it is more efficient to allow for replacement of one single sense circuit with a redundant sense circuit. In this way, only a defective memory cell is replaced with a redundant cell, while all the other working cells that share the same address of the defective memory cell, are not replaced. For example, for a 2048 bit program buffer for 2048 cells written in parallel, the memory device has 2048 senses and sense circuits that perform the verify operation and that control the bit line voltage. This requires a 2048-bit bus to be able to switch off any one of the 2048 senses. If there are sixteen I/O bits for the memory device, there will be 128 control wires for each one of the sixteen I/O bits. As a result, a large amount of circuits are needed to be able to load and activate every one of the redundant senses.

In prior art redundant column systems, an address comparison is not performed during the command cycle. In fact, in prior art devices, data provided by a user are loaded in the senses of a program buffer and address comparisons are performed at a later time during the execution of an embedded program algorithm. Therefore, in prior art systems, the number of signal lines that are required to disable the senses of the program buffer is equal to the number of senses. In flash memory devices the program command is clocked by an external signal provided by the user, commonly called "write enable" (WE). The user, in the case of a 2048 bits program buffer, applies 128 words (data to be programmed) along with 128 addresses (location of the memory where the data have to be written). The rising edge of "write enable" signal latches the address and the data given to the memory. Thus, at each cycle of WE signal, a single 16 bit word to be programmed along with its address is applied to the memory. In this example, to fill completely the program buffer, 128 WE cycles are needed.

SUMMARY OF THE INVENTION

One embodiment includes a memory having column redundancy that includes a regular memory array having regular column decoders and regular senses. Also included is a redundant memory array having a redundant column decoder and redundant senses. Redundant latches are coupled to one of the redundant senses. Redundancy comparison logic compares an address of a defective regular memory cell with input addresses to disable the regular senses for a defective regular memory and to enable a corresponding redundant latch that is coupled to one of the redundant senses to activate a redundant column in the redundant memory array.

Another embodiment is for a column redundancy system is a redundant memory array that has r columns of redundant memory cells. A number r of redundant senses is provided. A redundant column decoder is coupled between the redundant memory array and the r redundant senses. Redundant address registers store addresses of defective regular memory cells. Redundant latches are provided in n groups of r latches, where each of the r redundant latches form a group is coupled to a respective one of the r redundant column senses. Redundancy comparison logic compares addresses of defective regular memory cells stored in the redundant address registers with an external input address. If the comparison is true, what is provided is: a DISABLE_LOAD signal to disable the regular senses for one of the n groups of m columns, an ENABLE_LATCH signal to one of the n groups of r latches to enable corresponding redundant latches, and one or r REDO signals to a respective one of the r redundant latches in one of the n groups that is disabled. The selected one of the redundant latches activates one of the r redundant senses to activate one of the redundant columns.

Another embodiment provides a flash memory having column redundancy. The flash memory includes a regular memory array having n×m columns of regular memory cells collected in n groups of m columns. A number n×m of regular senses have n I/O terminals. A command user interface receives a memory enable signal to provide a LOAD_PL signal to the n×m regular senses to initiate operation of the regular senses. Means are provided for disabling the n×m regular senses. A column decoder is coupled between the regular memory array and the regular senses. A redundant memory array has r columns of redundant memory cells. A number r of redundant senses is provided. A redundant column decoder is coupled between the redundant memory array and the redundant senses. Redundant address registers store addresses of defective regular memory cells. Redundant latches are provided in n groups of r latches, where each of the r redundant latches from a group is coupled to a respective one of the r redundant column senses. Redundancy comparison logic compares addresses of defective regular memory cells stored in the redundant address registers with an external input address. If the comparison is true, what is provided is: a DISABLE_LOAD signal to disable the regular senses for one of the n groups of m columns, an ENABLE_LATCH signal to one of the n groups of r latches to enable corresponding redundant latches, and one or r REDO signals to a respective one of the r redundant latches in one of the n groups that is disabled. The selected one of the redundant latches activates one of the r redundant senses to activate one of the redundant columns.

Another embodiment includes a method of providing column redundancy for a memory that includes the steps of: coupling a redundant column decoder between a redundant memory array and a redundant sense; coupling a group of redundant latches to a respective redundant column sense; comparing an address of a defective regular memory cell with external input addresses; disabling regular senses; and enabling a redundant latch to activate a redundant sense for the redundant memory array.

BRIEF DESCRIPTION OF THE DRAWINGS

FIG. 7 is a circuit diagram of a redundant latch circuit that has an open drain output.

DETAILED DESCRIPTION

Figure 4:
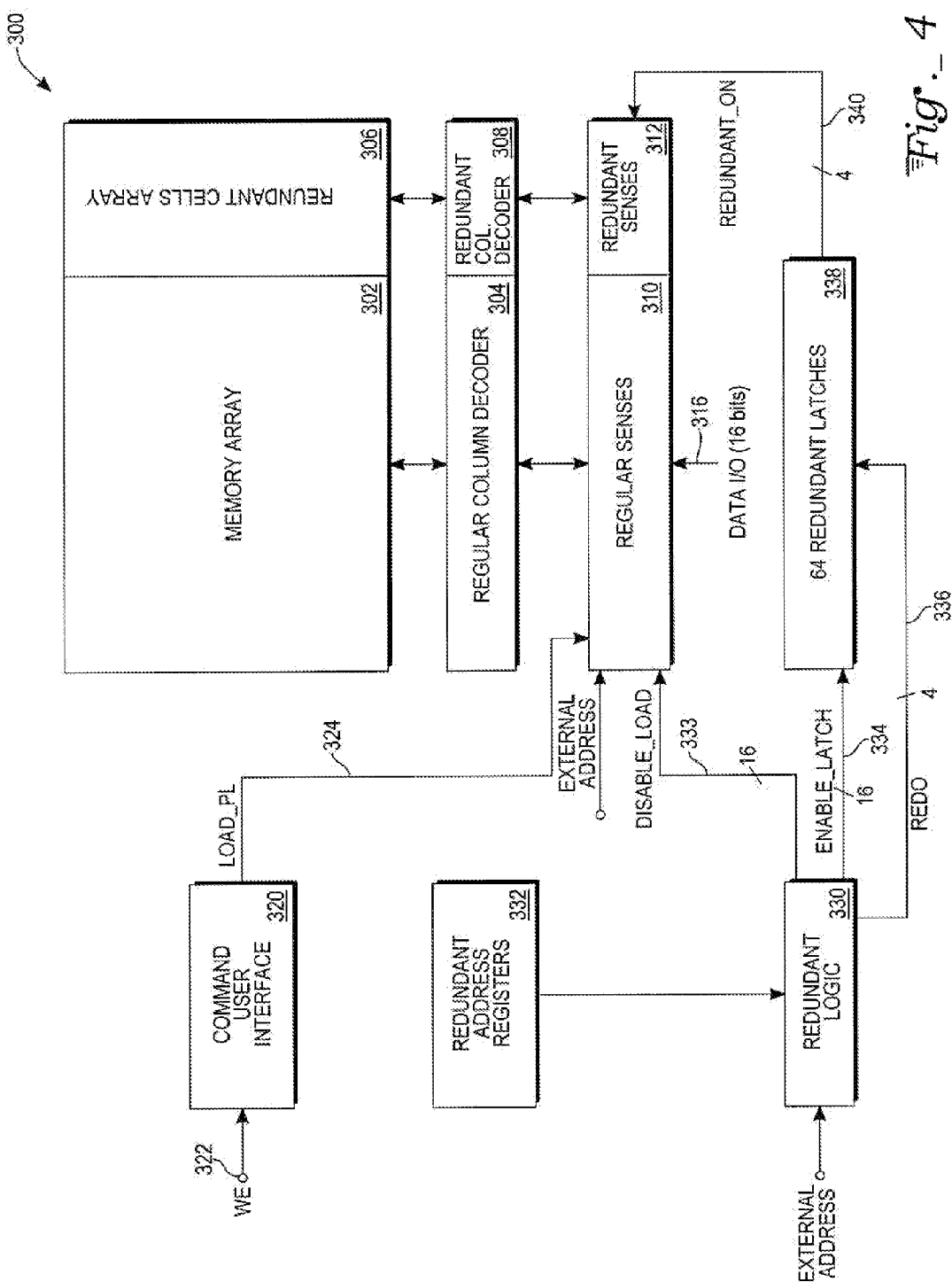
FIG. 4 is a block diagram of a flash memory redundant column system according to the present invention.

FIG. 4 illustrates an exemplary embodiment of a flash memory redundant column system 300 according to the present invention. To illustrate the invention, an 8 Mbit regular flash memory array 302 with 4096 rows and 2048 columns is discussed. The columns of the regular flash memory array 302 are coupled to regular column decoder circuits 304. For data that is originally designated for storage in one of the defective memory cells in the regular flash memory array 302, a redundant 4-column array 306 is provided. The redundant 4-column array 306 is coupled to redundant 4-column decoders 308. The regular senses 310 have, for example, sixteen I/O lines 316.

For a regular flash memory array 302, each of the 2048 columns of the regular flash memory array 302 is coupled to a corresponding one of 2048 regular column decoder circuits 304 and then to a corresponding one of 2048 regular senses 310. The redundant column decoder 308 is coupled to four redundant senses 312. The regular flash memory array 302 has 2048 columns that are arranged in 16 groups of 128 columns. The regular senses 310 have 16 column outputs and 128 sense circuits for each output for a total of 2048 senses. Four columns are provided in the redundant memory array 306 along with four redundant column decoders and four redundant senses 312. As described below, redundant address registers are provided to store addresses of defective memory cells.

A command user interface (CUI) circuit 320 receives a write enable (WE) signal at a terminal 322 and provides on signal line 324 an output signal LOAD_PL, which is a pulsed signal generated by the rising edge of the WE signal. The LOAD_PL pulse triggers the latching of data and addresses in the regular senses 310. A redundant logic circuit 330 compares an external input address with the outputs of redundant address registers 332. If the comparison is true, a DISAB_LOAD signal on a bus 333 is generated. This signal inhibits the LOAD_PL signal from the CUI 320 on signal line 324 so that input data applied by a user on one of the lines of the DATA I/O bus 316 are not loaded into a corresponding one of the senses 310. There are 16 possible DISAB_LOAD signals, one for each of the 16 data outputs provided on one of the sixteen I/O lines 316.

The present invention uses a reduced number of control signals and requires fewer circuits to provide redundant columns for the flash memory redundant column system 300. The present invention provides a group 338 of 64 redundant latches. The 64 redundant latches are arranged in groups of four that are assigned to a respective one of the sixteen memory I/O lines of the bus 316. Each one of the 64 redundant latches is an open drain circuit that is coupled to an input lines of one of the four redundant senses 312.

During a command cycle, a redundant address comparison is performed during the WE time period mentioned above. If redundant column is needed, then one of the 64 latches of the group 338 is set for a defective memory cell and the corresponding one of the 2048 regular senses 310 is not loaded with input data. If a data bit is to be programmed into a defective memory location, one of the 64 latches is set to pull down an input line of one of the four redundant sense 312 to thereby take control of the respective one of the sixteen bit lines so that the data bit is programmed into the redundant memory array 306.

If a redundant memory cell is needed for a certain input address, the redundant logic circuit 330 generates a DISAB_LOAD signal, which inhibits loading of data into the regular sense amps. Also, one of sixteen ENABLE_LATCH signals is generated to set one of the four latches of the output for a defective cell. The latches are coupled by means of four open drain signals (REDUNDANT_ON} to four redundant sense amps. There are sixteen ENABLE_LATCH signals, one of which is generated by the redundant logic 330 for one of the I/O lines 316. To select one of the four latches that are assigned to a particular one of the sixteen I/O lines 316, one of four signals REDO<0>, REDO<1>, REDO<2>, REDO<3> are activated on one of four lines 336 to select one of the four latches associated with one of the I/O lines 316. The activated sense provides a redundant memory cell for the defective regular memory cell. The four REDO signals are provided on one of four signal lines of a bus 336. One of four REDUNDANT_ON signals is provided to select one of the fourth redundant senses 312.

Figure 5:
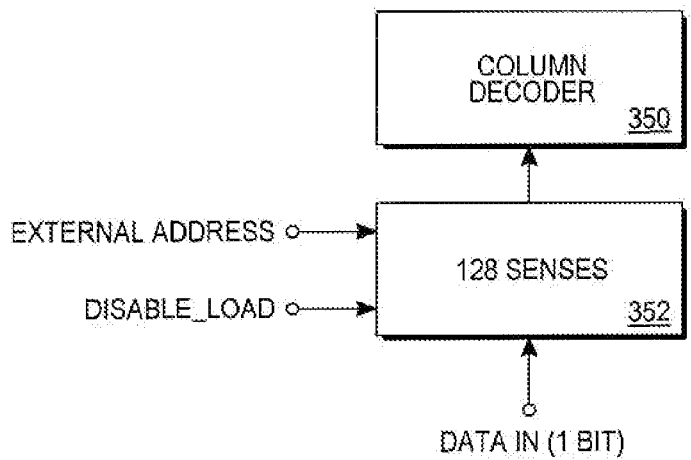
FIG. 5 is a block diagram of a column decoder and senses for a single I/O line of a memory system.

FIG. 5 shows buffer arrangement for one of the sixteen I/O lines 316 of FIG. 4. For each of the sixteen outputs a corresponding group of 128 senses 352 are coupled to the memory array through a column decoder 350 for a group of 128 columns. The outputs of the senses 352 are all coupled to an external address, one of the sixteen DISABLE_LOAD signals on the bus 333, and one of the sixteen I/O lines 316. The DISABLE_LOAD signal inhibits data loading into a sense when an external address is provided for a defective memory cell.

Figure 6:
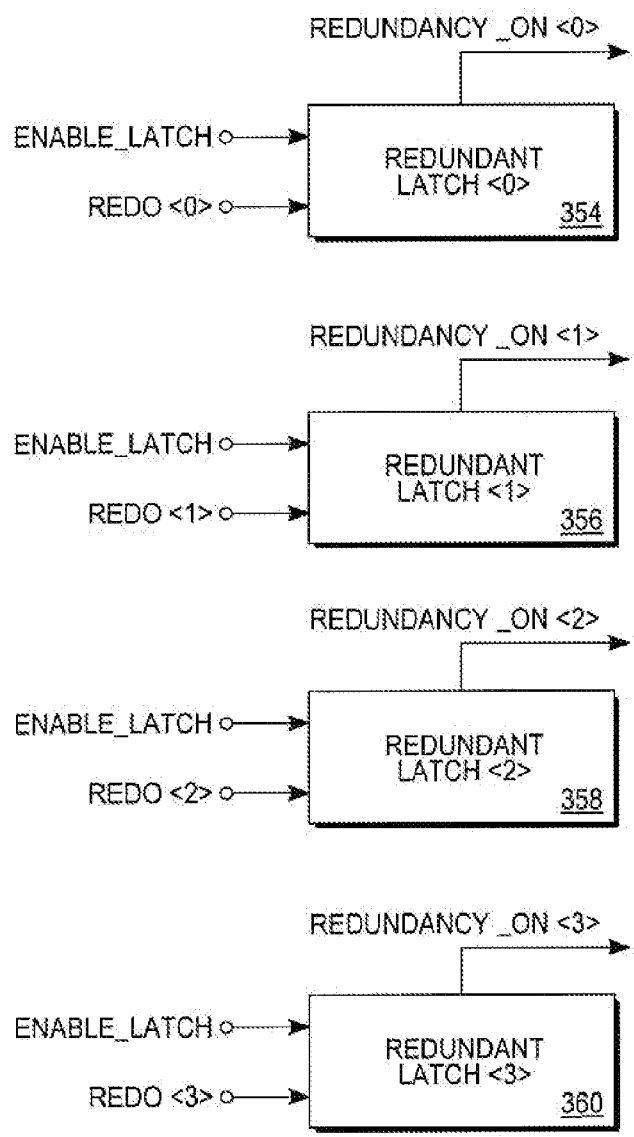
FIG. 6 is a block diagram that illustrates four redundant latches that enable one of four redundant senses.

FIG. 6 shows that each of the four redundant latches 354, 356, 358, 360 has as an input the ENABLE_LATCH signal that is generated by the redundant logic circuit 330 on a signal line in the bus 334. Each of the four redundant latches also has as an input a respective one of the REDO <0:3> signals. REDO<0:3> signals are generated by the redundant logic circuit 330 of FIG. 4 to select one of the four redundant latches 354, 356, 358, 360. The outputs of the redundant latches are the REDUNDANT_ON <0:3> signals that are open drain signals used to activate one of the redundant senses 312.

FIG. 7 illustrates one circuit implementation for the redundant latches 354, 356, 358, 360 that have open drain outputs. Each one of the outputs of the 64 latches for one of the sixteen I/O lines of the bus 316 is coupled to an input line of a redundant sense. For instance, the first of the four latches for each of the sixteen I/O lines is coupled to an input of the first redundant sense by means of an open drain circuit. Each input of each one of the four redundant senses has sixteen open-drains coupled to it. Cross-coupled inverters 361, 362 provide a latch circuit that has an input terminal of the inverter 361 coupled to an output terminal of the inverter 362 and that has an output terminal of the inverter 361 coupled to an input terminal of the inverter 362. An input terminal of the inverter 361 is coupled to a drain terminal of a REDO selection NMOS transistor 366. An input signal REDO is coupled to a gate terminal of the REDO selection NMOS transistor 366. A source terminal of the REDO selection NMOS transistor 366 is coupled to a drain terminal of a latch enable transistor 364. A source terminal of the transistor 364 is coupled to ground. A gate terminal of the latch enable transistor 364 is coupled to an ENABLE_LATCH input terminal.

Flash memory timing specifications require a minimum time period to be provided between address/data changes and before address/data latching at the rising edge of a Write Enable (WE) signal in order that all the address and data signals are stable for a sufficient time. The present invention uses this minimum time period to compare an input address with the addresses stored in the redundant address registers 332. If the comparison is true, a redundant latch is set by the redundant logic circuit 330.

During a command cycle, a redundant address comparison is performed during the minimum time period mentioned above. If an input address is for a defective regular memory cell, then one of the 64 latches 338 is set with one of the sixteen ENABLE_LATCH signals on the bus 334. Input data is not loaded into a corresponding one of the senses 310. If a data bit is to be programmed into a redundant column, the one of the four latches provides a signal on the four line bus 340 to pull down the input line of a corresponding one of the redundant senses 312. It is worth noting that the redundant senses 312 are always on, regardless of data to be written. Despite this, only when one of the input lines on the bus 340 is pulled down by one of the latches 338 coupled to it does that one of the redundant senses 312 take control of the corresponding bit line so that an input bit is programmed into the redundant memory cell array 308.

In summary, the present invention provides redundant columns for a flash memory with a reduced number of circuits and control. A minimum time period between address/data changes and address/data latching (write enable WE rising edge) is used to compare input addresses with addresses in a redundant address register. For each of the 16 memory outputs there are 128 sense amps that are coupled to the memory array by means of a column decoder. The sense amps have address inputs and data inputs as well as a DISABLE_LOAD signal that inhibits the data loading when a redundant address occurs. The four redundant latches have as inputs the ENABLE_LATCH signal, generated by the redundant logic and REDO <3:0> signals, which are generated by the redundant address register and are used to choose one of the four redundant latches. The outputs of the four redundant latches are the REDUNDANT_ON<3:0> signals, which are open drain signals that are used to activate the redundant sense amps.

What is claimed is:

1. A memory having column redundancy, comprising:
   a regular memory array having regular column decoders and regular senses;
   a redundant memory array having a redundant column decoder and redundant senses;
   redundant latches that are coupled to one of the redundant senses, wherein the redundant latches include cross-coupled inverter circuits each configured to receive an activation signal operable to activate a selected latch and to receive an enabling signal operable to enable the selected latch, and to generate an output operable to activate a corresponding redundant sense;
   redundancy comparison logic that compares an address of a defective regular memory cell with input addresses to disable the regular senses for a defective regular memory and to enable a corresponding redundant latch that is coupled to one of the redundant senses to activate a redundant column in the redundant memory array.

2. A column redundancy system for a flash memory, comprising:
   a redundant memory array having r columns of redundant memory cells:
   r redundant senses:
   a redundant column decoder coupled between the redundant memory array and the r redundant senses:
   redundant address registers that store addresses of defective regular memory cells;
   n groups of r redundant latches, where each of the r redundant latches from a group is coupled to a respective one of the redundant column senses, wherein each of the redundant latches includes a latch circuit that has a latch input terminal and a latch output terminal and that includes a pair of cross-coupled inverters that have an input terminal of one coupled to an output terminal of the other;
   redundancy comparison logic that compares addresses of defective regular memory cells stored in the redundant address registers with an external input address and, if the comparison is true, that provide a DISABLE LOAD signal to disable the regular senses for one of the n groups of m columns, that provides an ENABLE LATCH signal to one of the n groups of r latches to enable corresponding redundant latches, and that provides one of r REDO signals to a respective one of the r redundant latches in one of the one of the n groups that is disabled; and
   wherein the selected one of the redundant latches activates one of the r redundant senses.

3. The column redundancy system of claim 2 wherein the redundant senses are activated by being pulled down by one of the redundant latches.

4. The column redundancy system of claim 3 wherein the n×r redundant latches are open drain circuits that allow n redundant latches on each of the r redundant senses.

5. The column redundancy system of claim 2 wherein each of the redundant latches includes an input circuit that requires both an ENABLE_LATCH signal and one of the REDO signals to activate a redundant latch.

6. The column redundancy system of claim 5 wherein the input circuit for each of the redundant latches includes two series coupled transistors, one of which is turned on by an ENABLE_LATCH signal and the other of which is turned on by a REDO signal.

7. The column redundancy system of claim 6 wherein each of the redundant latches includes an NMOS output transistor that has a gate terminal coupled to the output terminal of the latch, that has a source coupled to a ground terminal, and that has an open drain that is coupled to one of the r redundant senses.

8. The column redundancy system of claim 2 wherein the memory enable signal that provides the LOAD_PL signal to the n×m regular senses to initiate operation of the regular senses is a write enable (WE) signal for the flash memory.

9. A flash memory having column redundancy, the flash memory comprising:
   a regular memory array having n×m columns of regular memory cells collected in n groups of m columns;
   n×m regular senses having n I/O terminals;
   a command user interface that receives a memory enable signal to provide a LOAD_PL signal to the n×m regular senses to initiate operation of the regular senses;
   means for disabling the n×m regular senses;
   a column decoder coupled between the regular memory array and the regular senses;
   a redundant memory array having r columns of redundant memory cells;
   r redundant senses in electrical communication with the regular senses;
   a redundant column decoder coupled between the redundant memory array and the r redundant senses;
   redundant address registers that store addresses of defective regular memory cells;
   r redundant latches in n groups of redundant latches, where each of the r redundant latches from a group is coupled to a respective one of the redundant senses, and wherein each of the redundant latches includes a latch circuit that has a latch input terminal and a latch output terminal and that includes a pair of cross-coupled inverters that have an input terminal of one coupled to an output terminal of the other;
   redundancy comparison logic that compares addresses of defective regular memory cells stored in the redundant address registers with an external input address and, if the comparison is true, that provide a DISABLE_LOAD signal to disable the regular senses for one of the n groups of m columns, that provides an ENABLE_ LATCH signal to one of the n groups of r latches to enable corresponding redundant latches, and that provides one of r REDO signals to a respective one of the r redundant latches in one of the n groups that is disabled; and wherein the selected one of the redundant latches activates one of the r redundant senses to activate one of the redundant columns.

10. The flash memory of claim 9 comprising means for activating the redundant senses by being pulled down by one of the redundant latches.

11. The flash memory of claim 10 wherein then n×r redundant latches are open drain circuits that allow n redundant latches to be coupled with each of the r redundant senses.

12. The flash memory of claim 9 wherein each of the redundant latches includes an input circuit that requires both an ENABLE_LATCH signal and one of the REDO signals to activate a redundant latch.

13. The flash memory of claim 12 wherein the input circuit for each of the redundant latches includes two series coupled transistors, one of which is turned on by an ENABLE_LATCH signal and the other of which is turned on by a REDO signal.

14. The flash memory of claim 13 wherein each of the redundant latches includes an NMOS output transistor that has a gate terminal coupled to the output terminal of the latch, that has a source coupled to a ground terminal, and that has an open drain that is coupled to one of the r redundant senses.

15. The flash memory of claim 9 wherein the memory enable signal that provides the LOAD_PL signal to the n×m regular senses to initiate operation of the regular senses is a write enable (WE) signal for the flash memory.

16. A method of providing column redundancy for a memory, comprising:
coupling a redundant column decoder between a redundant memory array and a redundant column sense;
coupling a group of redundant latches to a respective redundant column sense wherein the redundant latches include cross-coupled inverter circuits each configured to receive an activation signal operable to activate a selected latch and to receive an enabling signal operable to enable the selected latch;
comparing an address of a defective regular memory cell with external input addresses;
disabling regular senses; and
enabling a redundant latch in response to an output of a corresponding cross-coupled inverter circuit to activate a redundant sense for the redundant memory array.

17. The method of claim 16 including activating the redundant sense by pulling it down by a selected one of the redundant latches.

18. The method of claim 17 including selecting one of a group of redundant latches.

19. A column redundancy system for a flash memory, comprising:
a redundant memory array having r columns of redundant memory cells;
r redundant senses;
a redundant column decoder coupled between the redundant memory array and the r redundant senses;
redundant address registers that store addresses of defective regular memory cells;
n groups of r redundant latches, where at least one of the r redundant latches from a group is coupled to a respective one of the redundant column senses;
redundancy comparison logic that compares addresses of defective regular memory cells stored in the redundant address registers with an external input address and, if the comparison is true, that provide a DISABLE_LOAD signal to disable the regular senses for one of the n groups of m columns, that provides an ENABLE_LATCH signal to one of the n groups of r latches to enable corresponding redundant latches, and that provides one of r REDO signals to a respective one of the r redundant latches in one of the one of the n groups that is disabled, wherein at least one of the redundant latches includes an input circuit that requires both an ENABLE_LATCH signal and one of the REDO signals to activate a redundant latch; and wherein the selected one of the redundant latches activates one of the r redundant senses.

20. The column redundancy system of claim 19, wherein the redundant senses are activated by being pulled down by one of the redundant latches.

21. The column redundancy system of claim 20, wherein the n×r redundant latches are open drain circuits that allow n redundant latches on each of the r redundant senses.

22. The column redundancy system of claim 19, wherein the input circuit for each of the redundant latches includes two series coupled transistors, one of which is turned on by an ENABLE_LATCH signal and the other of which is turned on by a REDO signal.

23. The column redundancy system of claim 22, wherein each of the redundant latches includes an NMOS output transistor that has a gate terminal coupled to the output terminal of the latch, that has a source coupled to a ground terminal, and that has an open drain that is coupled to one of the r redundant senses.

24. The flash memory of claim 23 wherein at least of the redundant latches includes an NMOS output transistor that has a gate terminal coupled to the output terminal of the latch, that has a source coupled to a ground terminal, and that has an open drain that is coupled to one of the r redundant senses.

25. The flash memory of claim 22, wherein the input circuit for at least one of the redundant latches includes two series coupled transistors, one of which is turned on by an ENABLE_LATCH signal and the other of which is turned on by a REDO signal.

26. The memory of claim 25 wherein a plurality of redundant latches are coupled to a redundant sense and the redundant sense is activated by one of the redundant latches.

27. The memory of claim 25 wherein the redundant latches are open drain circuits that allow a number of redundant latches to be coupled to a redundant sense.

28. A flash memory having column redundancy, the flash memory comprising:
a regular memory array having n×m columns of regniar memory cells collected in n groups of m columns;
n×m regnlar senses having n I/O terminals;
a command user interface that receives a memory enable signal to provide a LOAD_PL signal to the n×m regular senses to initiate operation of the regular senses;
a disabling circuit to disable the n×m regular senses;
a column decoder coupled between the regular memory array and the regular senses;
a redundant memory array having r columns of redundant memory cells;
r redundant senses in electrical communication with the regular senses;
a redundant column decoder coupled between the redundant memory array and the r redundant senses;
redundant address registers that store addresses of defective regular memory cells;

r redundant latches in n groups of redundant latches, where each of the r redundant latches from a group is coupled to a respective one of the redundant senses;

redundancy comparison logic that compares addresses of defective regular memory cells stored in the redundant address registers with an external input address and, if the comparison is true, that provide a DISABLE_LOAD signal to disable the regular senses for one of the n groups of m columns, that provides an ENABLE_LATCH signal to one of the n groups of r latches to enable corresponding redundant latches, and that provides one of r REDO signals to a respective one of the r redundant latches in one of the n groups that is disabled, wherein each of the redundant latches includes an input circuit that requires both an ENABLE_LATCH signal and one of the REDO signals to activate the redundant latch; and wherein the selected one of the redundant latches activates one of the r redundant senses to activate one of the redundant columns.

29. A flash memory having column redundancy, the flash memory comprising:

a regular memory array having n×m columns of regular memory cells collected in n groups of m columns;

n×m regular senses having n I/O terminals;

a command user interface that receives a memory enable signal to provide a LOAD_PL signal to the n×m regular senses to initiate operation of the regular senses, wherein the memory enable signal that provides the LOAD_PL signal includes a write enable (WE) signal;

a disabling device to disable the n×m regular senses;

a column decoder coupled between the regular memory array and the regular senses;

a redundant memory array having r columns of redundant memory cells;

r redundant senses in electrical communication with the regular senses;

a redundant column decoder coupled between the redundant memory array and the r redundant senses;

redundant address registers that store addresses of defective regular memory cells;

r redundant latches in n groups of redundant latches, wherein the r redundant latches from a group is coupled to a respective one of the redundant senses;

redundancy comparison logic that compares addresses of defective regular memory cells stored in the redundant address registers with an external input address and, if the comparison is true, that provide a DISABLE_LOAD signal to disable the regular senses for one of the n groups of m columns, that provides an ENABLE_LATCH signal to one of the n groups of r latches to enable corresponding redundant latches, and that provides one of r REDO signals to a respective one of the r redundant latches in one of the n groups that is disabled; and wherein the selected one of the redundant latches activates one of the r redundant senses to activate one of the redundant columns.

* * * * *

UNITED STATES PATENT AND TRADEMARK OFFICE
CERTIFICATE OF CORRECTION

PATENT NO. : 7,551,498 B2
APPLICATION NO. : 11/611452
DATED : June 23, 2009
INVENTOR(S) : Simone Bartoli et al.

It is certified that error appears in the above-identified patent and that said Letters Patent is hereby corrected as shown below:

On the face page, in field (57), under "Abstract", in column 2, line 11, delete "disables" and insert -- disable --, therefor.

On the face page, in field (57), under "Abstract", in column 2, line 11, delete "or" and insert -- of --, therefor.

Figure 1:
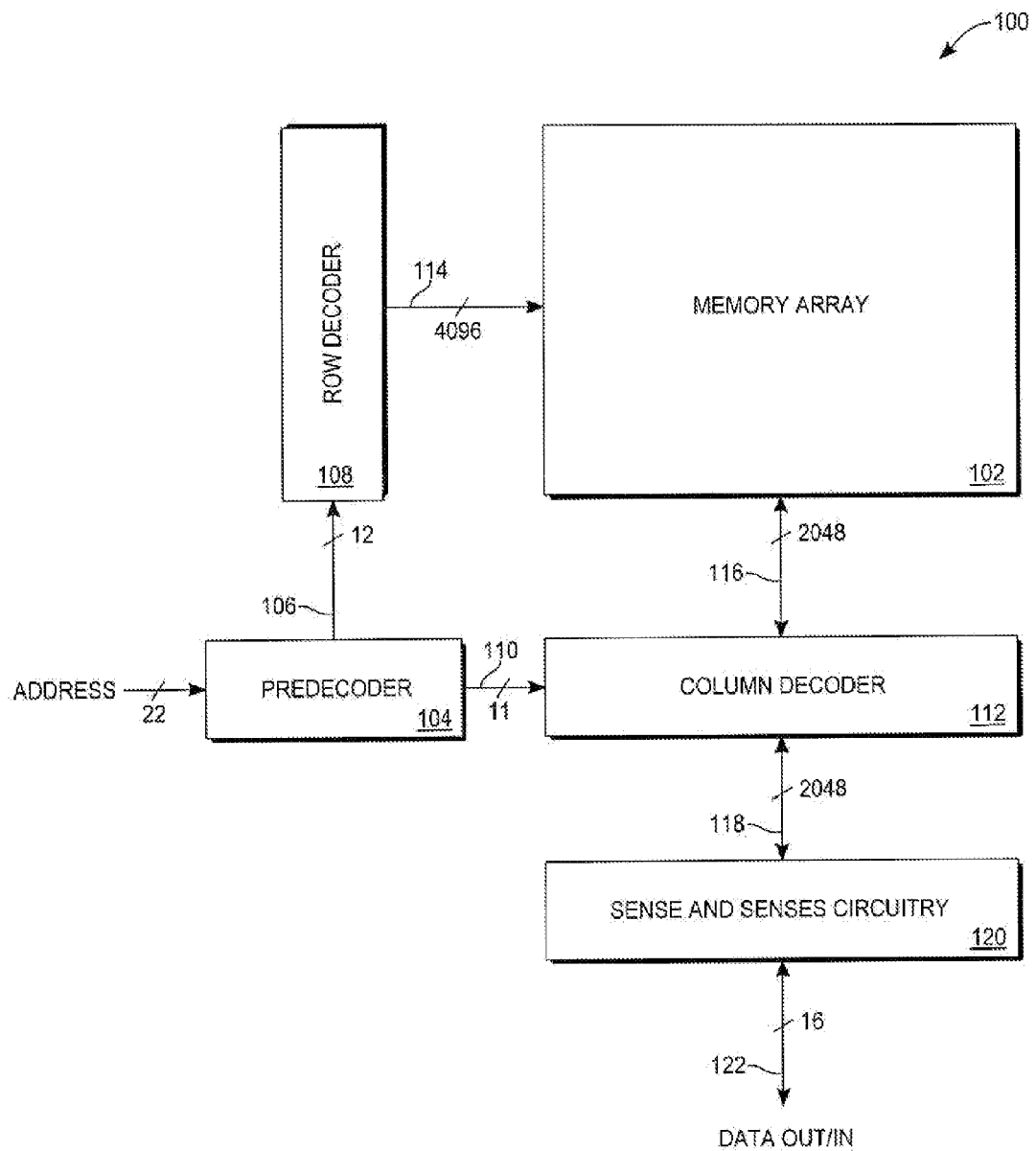
FIG. 1 is a block diagram for a flash memory device of the present invention.
Figure 2:
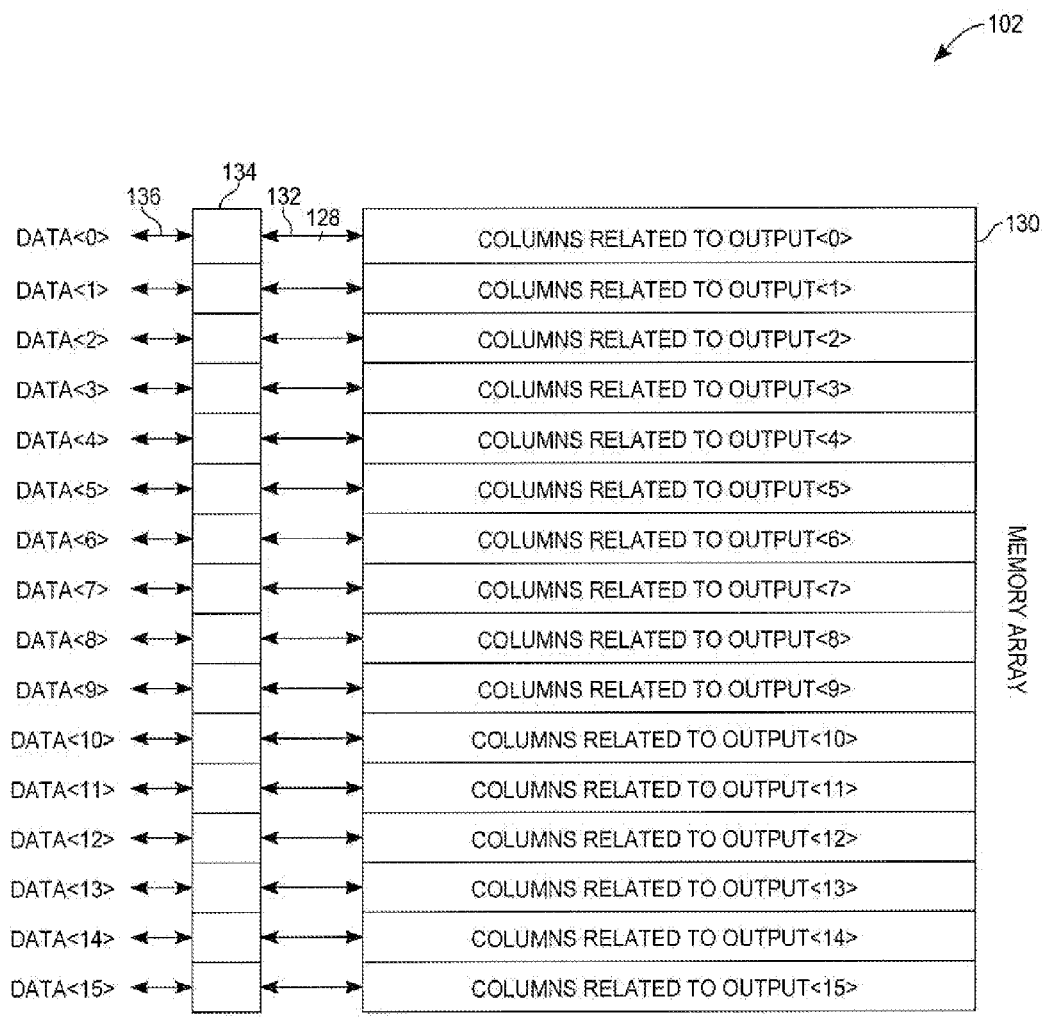
FIG. 2 is a diagram that illustrates how 2048 columns are arranged in 16 groups of 128 columns to provide sixteen I/O lines.
Figure 3:
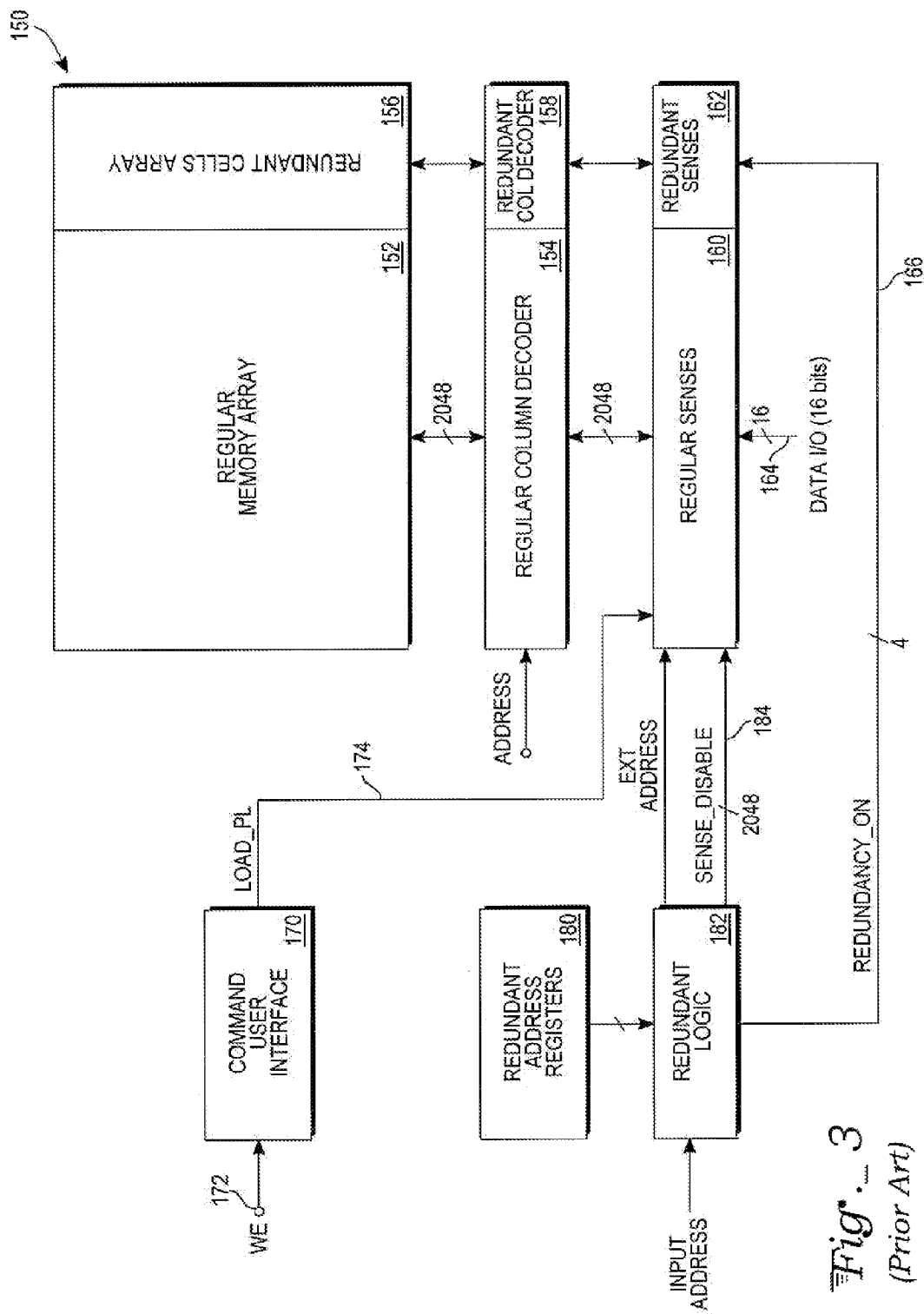
FIG. 3 a block diagram of a prior art flash memory redundant column system.

On Sheet 3 of 6, Figure 3, above Reference Numeral 156, line 1, delete "REUNDANT" and insert -- REDUNDANT --, therefor.

On Sheet 3 of 6, Figure 4, above Reference Numeral 306, line 1, delete "REUNDANT" and insert -- REDUNDANT --. therefor.

In column 1, line 34, delete "119." and insert -- 118. --, therefor.

In column 4, line 17, after "the" insert -- r --.

In column 4, line 28, delete "or" and insert -- of --, therefor.

In column 5, line 63, delete "(REDUNDANT_ON}" and insert -- (REDUNDANT_ON) --, therefor.

In column 6, line 7, delete "fourth" and insert -- four --, therefor.

In column 6, line 24, delete "REDO<0:3>" and insert -- The REDO <0:3> --, therefor.

In column 7, line 49, in Claim 2, delete "cells:" and insert -- cells; --, therefor.

In column 7, line 50, in Claim 2, delete "senses:" and insert -- senses; --, therefor.

In column 7, line 52, in Claim 2, delete "senses:" and insert -- senses; --, therefor.

In column 7, line 66, in Claim 2, delete "DISABLE LOAD" and insert -- DISABLE_LOAD --, therefor.

In column 8, lines 1-2, in Claim 2, delete "ENABLE LATCH" and insert -- ENABLE_LATCH --, therefor.

In column 8, line 5, in Claim 2, before "n" delete "one of the".

CERTIFICATE OF CORRECTION (continued)
U.S. Pat. No. 7,551,498 B2

In column 9, line 37, in Claim 16, delete "colunm sense" and insert -- column sense, --, therefor.

In column 9, line 64, in Claim 19, delete "colunm" and insert -- column --, therefor.

In column 10, line 7, in Claim 19, before "n" delete "one of the".

In column 10, line 32, in Claim 24, after "least" insert -- one --.

In column 10, line 50, in Claim 28, delete "regniar" and insert -- regular --, therefor.

In column 10, line 52, in Claim 28, delete "regnlar" and insert -- regular --, therefor.

In column 11, line 2, in Claim 28, delete "ftom" and insert -- from --, therefor.

In column 12, line 2, in Claim 29, delete "colunm" and insert -- column --, therefor.

Signed and Sealed this

Sixteenth Day of February, 2010

David J. Kappos
*Director of the United States Patent and Trademark Office*